US006834381B2

United States Patent
Gonzalez

(10) Patent No.: US 6,834,381 B2
(45) Date of Patent: Dec. 21, 2004

(54) REDISTRIBUTION METAL FOR OUTPUT DRIVER SLEW RATE CONTROL

(75) Inventor: Jason Gonzalez, Ft Collins, CO (US)

(73) Assignee: Agilent Technolgies, Inc., Palo Alto, CA (US)

( * ) Notice: Subject to any disclaimer, the term of this patent is extended or adjusted under 35 U.S.C. 154(b) by 210 days.

(21) Appl. No.: 10/044,122

(22) Filed: Jan. 10, 2002

(65) Prior Publication Data

US 2003/0131329 A1 Jul. 10, 2003

(51) Int. Cl.[7] .............................. G06F 17/50; G06F 9/45
(52) U.S. Cl. ............................................. 716/13; 716/6
(58) Field of Search ................................ 716/1, 2, 4, 5, 716/6, 10, 11, 12, 13, 15

(56) References Cited

U.S. PATENT DOCUMENTS

| | | | |
|---|---|---|---|
| 5,699,264 A | * 12/1997 | Nakamura et al. | ............. 716/6 |
| 6,038,383 A | * 3/2000 | Young et al. | ................... 716/5 |
| 6,182,269 B1 | * 1/2001 | Laubhan | ......................... 716/5 |
| 6,198,635 B1 | 3/2001 | Shenoy et al. | .............. 361/760 |
| 6,279,142 B1 | * 8/2001 | Bowen et al. | .................. 716/5 |
| 6,345,380 B1 | * 2/2002 | Bonaccio et al. | ............. 716/12 |
| 6,353,917 B1 | * 3/2002 | Muddu et al. | ................. 716/6 |

* cited by examiner

Primary Examiner—Leigh M. Garbowski

(57) ABSTRACT

A novel method and apparatus is presented for controlling the slew rate of a transitioning signal on an integrated circuit transmission line. The signal driver which drives the signal onto the transmission line is connected to the transmission line via redistribution metal characterized by a characteristic capacitance appropriate to adjust the RC time constant of the transmission line to shape the signal edges to a slope resulting in the desired slew rate.

6 Claims, 8 Drawing Sheets

REDISTRIBUTION METAL FOR OUTPUT DRIVER SLEW RATE CONTROL

FIELD OF THE INVENTION

The present invention pertains generally to integrated circuit devices, and more particularly to a method for using redistribution metal to control the slew rate of output drivers.

BACKGROUND OF THE INVENTION

As integrated circuit devices become increasingly faster and more complex, the performance achievable in an integrated circuit system can be limited by the interconnections between such devices with one another and with other components on a circuit board. Whereas integrated circuit devices once had only a few interconnects, often hundreds of interconnects are now required in more complex devices. Forming hundreds of interconnects between a chip and circuit board, however, can be difficult since chips are typically fabricated with significantly finer resolution than that of circuit boards. Thus, to connect a fine resolution chip to a circuit board, often some form of packaging is required to route signals between the chip and the circuit board.

The resolution of a component such as a chip or circuit board is often represented in terms of "pitch", which is the minimum distance between interconnects on a component. For example, chips may have off-chip interconnects separated by 200 microns or less, while a typical circuit board may only be capable of utilizing interconnects separated by 800 to 1000 microns or more. To provide the necessary interface, a chip package is typically used that has a substrate with one side having interconnects disposed at a corresponding pitch for the chip, and with the other side having interconnects disposed at a corresponding pitch for the circuit board. Conductive traces, herein referred to as "redistribution metal", disposed within one or more layers in the package substrate then route the signals between the chip and the circuit board, using vias and/or through holes to route signals between multiple layers.

System performance is often limited by noise on signals transmitted between between a chip package and a circuit board. One predominant form of noise results from parasitic capacitance, inductance, and resistance due to the signal routing between the signal pad on the integrated circuit die and the circuit board trace.

For a more complete understanding of the invention, FIG. 1 illustrates a circuit model diagram of a conventional output buffer 10 of an integrated circuit. Output driver 10 generally includes a pullup transistor 12 (such as p-channel field effect transistor (PFET) P1) and a pulldown transistor 14 (such as n-channel field effect transistor (NFET) N1). Output driver 10 also generally includes a predriver circuit 6 which generates a pullup signal PULLUP to control the pullup transistor 12 and a pulldown signal PULLDOWN to control the pulldown transistor 14. Predriver circuit 6 determines the states of pullup signal PULLUP and pulldown signal PULLDOWN based on the state of received data signal DATA, and typically also on the state of an output enable signal OE. Output enable signal OE is used to place the driver 10 into a high-impedance state whereby the driver 10 does not actively drive the pad 8. When the output driver 10 is enabled to actively drive the pad 8, the output signal OUT to be driven onto the pad 8 is derived from the data signal DATA, and is characterized by a driver output impedance $Z_D$.

When the pad 8 is to be driven to the high voltage level $V_{DD}$, the predriver circuit 6 asserts (negative true) the signal PULLUP, thereby turning on transistor 12 and pulling the pad 8 to $V_{DD}$. Conversely, when the pad 8 is to be driven to the low voltage level $V_{SS}$, the predriver circuit 6 asserts (positive true) the signal PULLDOWN, thereby turning on transistor 14 and pulling the pad 8 to $V_{SS}$. When the output driver 10 is not actively driving the pad 8, that is, when the output enable signal OE is not asserted, the predriver circuit 6 deasserts both the pullup signal PULLUP and the pulldown signal PULLDOWN, thereby turning off both transistors 12 and 14 and placing the pad 8 into a high-impedance state. Pullup signal PULLUP and pulldown signal PULLDOWN are never both simultaneously asserted.

Output buffer 10 is connected to an external transmission line 22 at output pad 8. The transmission line 22 is characterized by a characteristic impedance $Z_O$ and capacitance $C_O$ which together define the RC time constant of the line 22. As known in the art, the RC time constant of a transmission line affects the rate at which a signal OUT driven onto the line will change from one voltage rail to the other (i.e., $V_{DD}$-to-$V_{SS}$ or $V_{SS}$-to-$V_{DD}$). The signal on the transmission line 22 is also affected by a characteristic inductance $L_O$ in series between the pad 8 and power supply $V_{DD}$ of the integrated circuit. The inductance $L_O$ results from the bond connection (e.g., wire bond, ball bond) between the pad 8 and transmission line 22.

The characteristic impedance $Z_O$, capacitance $C_O$, and inductance $L_O$, are often termed the "parasitics" of the line 22 because, as is known in the art, these "parasitics" can be problematic in terms of signal noise and other performance factors. For example, one predominant problem resulting from transmission line parasitics is known as "simultaneously switching output" (SSO) noise. SSO noise occurs when multiple signals in close proximity to one another switch at the same time. The switching activity causes a large current spike flowing through the power and ground connections, resulting in power and ground supply bounce. The magnitude of the SSO noise depends on the effective inductance of the power and/or ground connections and the size of the current transient flowing therethrough. Accordingly, the faster the switching speed, the higher the SSO noise.

Reflection noise may also occur when the switching frequency approaches the RC time constant of the transmission line. The fast rise and fall of the high-speed signals on the line causes transients on the power supplies and undesirable wave reflections causing overshoot and undershoot.

Crosstalk noise arises when signals on parallel transmission lines are located too close in proximity to one another. Switching signals on an active line couple to less active or "quiet" parallel lines. Thus, the faster the rise time of the signal, the greater the crosstalk noise Another predominant problem that occurs with integrated circuit output drivers is known as "power supply droop". Due to large off-chip loads, output driver transistors N1 and P2 must be sized to allow sufficient current flow to the pad to meet the output load requirements. When several I/O drivers are attached to any one power pad, the demands on the power supply from the output drivers can cause signal droop on the power bus. Signal droop is problematic because it decreases the maximum current flow through the pullup driver PFET P2 and therefore decreases the speed at which the signal transitions to the high state. Thus, reflection noise is generated when the signal switching speed approaches the decreased rise time due to the power droop. Similar problems occur with the ground supply.

Because the magnitude of each of the above enumerated noise signals depends on the rise time of the signal, noise problems may be alleviated by slowing the "slew rate" (flattening out the transition edges) of the signals generated by the high speed output drivers of the chip.

Prior art methods of controlling the slew rate involve additional circuitry which attempts to control the switching speed of the driver itself. However, additional circuitry involves additional complexity, cost, and chip real estate. Accordingly, a need exists for an improved method for controlling the slew rate of integrated circuit signals with lower complexity, cost, and space.

SUMMARY OF THE INVENTION

The present invention is a technique for controlling the slew rate of integrated circuit output drivers by leveraging the parasitic capacitance of redistribution metal in the integrated circuit.

In accordance with the method of the invention, a desired slew rate for a signal generated by a signal driver is achieved by calculating a characteristic capacitance which together with the signal driver output impedance will produce a resulting time constant on the transmission line to achieve the desired slew rate. An interconnection path characterized by a redistribution metal characteristic capacitance substantially equal to the calculated characteristic capacitance is selected, and connected between the signal driver output and the transmission line.

The invention uses no additional circuitry for controlling the slew rate of integrated circuit signals, and therefore eliminates the circuit complexity, cost, and associated chip real estate corresponding to prior art methods for achieving the same result.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel technique for controlling the slew rate of output signals of integrated circuits using signal redistribution metal is described in detail hereinafter. Although the invention is described in terms of specific illustrative embodiments, it is to be understood that the embodiments described herein are by way of example only and the scope of the invention is not intended to be limited thereby.

Figure 1:
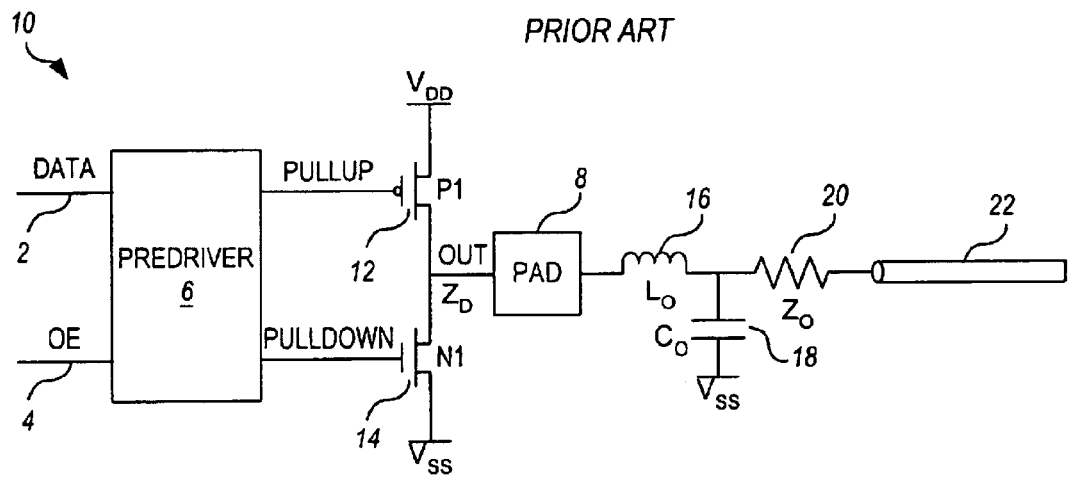
FIG. 1 is a circuit model diagram of a conventional output buffer of an integrated circuit.
Figure 2A:
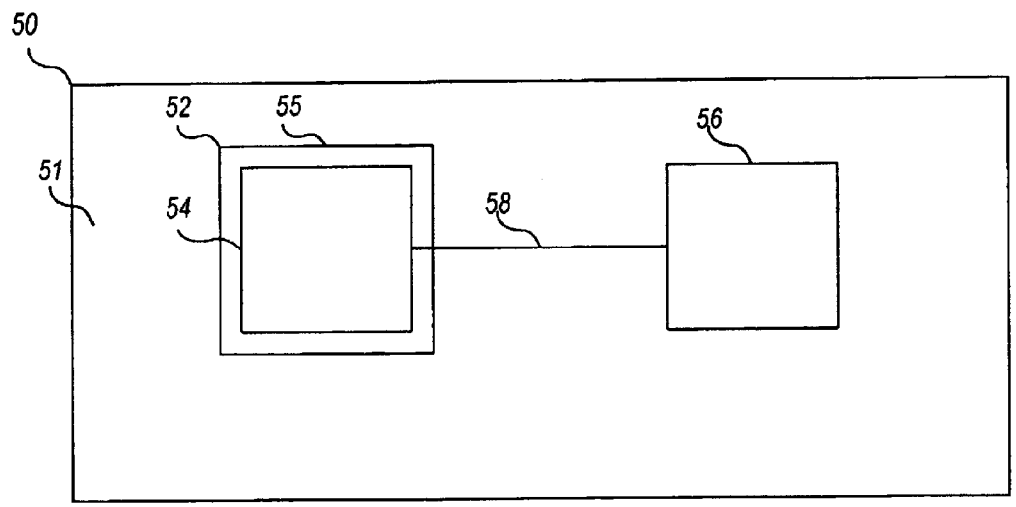
FIG. 2A is a top view of a conventional circuit board with integrated circuit devices thereon.
Figure 2B:
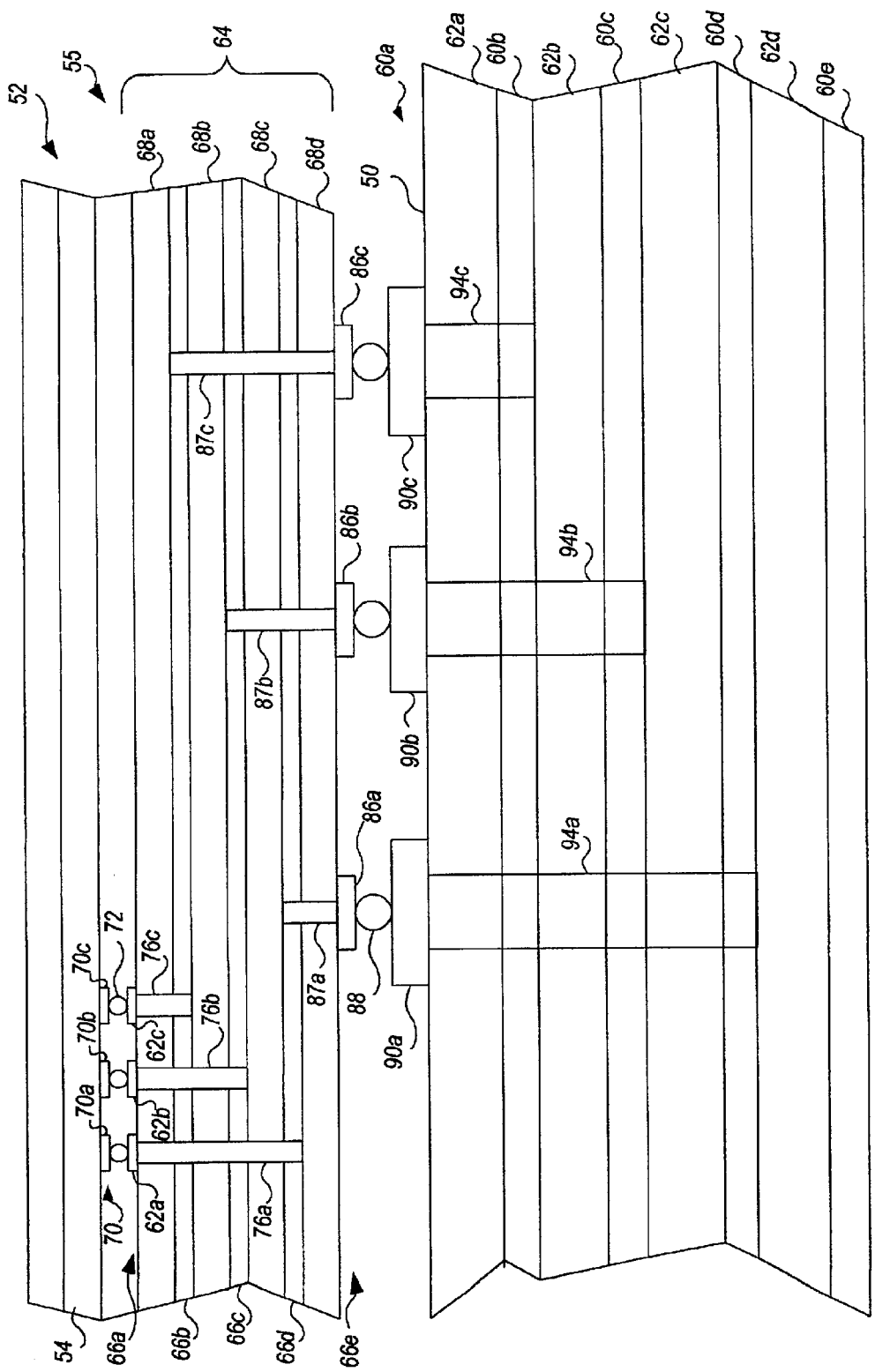
FIG. 2B is a cross-sectional view of the circuit board of FIG. 2A.
Figure 2C:
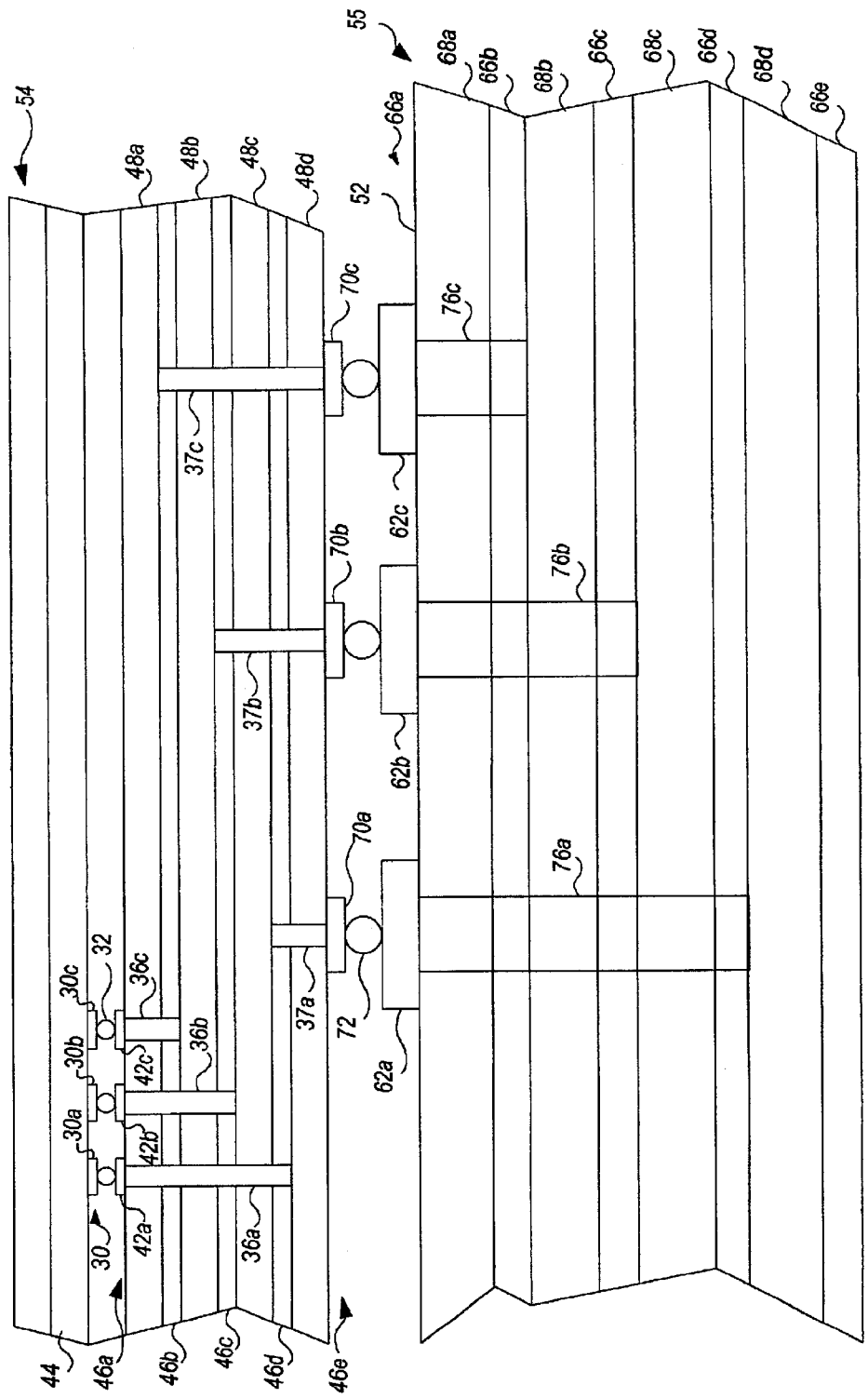
FIG. 2C is a cross-sectional view of the integrated circuit of FIG. 2A.

FIGS. 2A–2C illustrate the connection of an I/O integrated circuit pad with a circuit board transmission line via redistribution metal. FIG. 2A is a top view of a conventional circuit board 50 having a first surface 51 with at least one integrated circuit 52 mounted thereon. Integrated circuit 52 comprises a die 54 packaged in a package 55 and disposed on first surface 51 of the circuit board 50. In the illustrative embodiment, integrated circuit 52 communicates with at least one electronic component 56 (such as another integrated circuit) via a conductive trace, or transmission line 58. In practice, the circuit board 50 typically includes hundreds of transmission lines for routing signals between integrated circuits and other electronic components mounted thereon. However, for ease of illustration, only one such transmission line 58 is shown. Additionally, in reality transmission line 58 will often be routed on routing metal on one or more layers sandwiched inside the circuit board 50. Again, however, for purposes of simplicity, transmission line 58 is shown as a circuit board trace on the top metal layer of the circuit board 50.

FIGS. 2B and 2C illustrate a cross-sectional view of the circuit board 50 and the integrated circuit 54 of FIG. 2A. As shown therein, circuit board 50 may be constructed, for example, as a rigid circuit board including a plurality of conductive layers (e.g., 5 conductive layers) 60a, 60b, 60c, 60d and 60e separated by a plurality of rigid insulating substrate layers 62a, 62b, 62c, and 62d. Package 55 likewise includes a substrate 64 including a plurality of conductive layers 66a, 66b, 66c, 66d and 66e separated by a plurality of rigid insulating substrate layers 68a, 68b, 68c, and 68d. The number of layers in each of the circuit board 50 and package 55 will vary for different applications.

Integrated circuit 52 comprises a die 54, as shown in FIG. 2C. Die 54 is constructed as a semiconductor wafer with a circuit layer 44 and a plurality of dielectric layers 48a, 48b, 48c, 48d sandwiched between a plurality of conductive layers 46a, 46b, 46c, 46d, 46e. The number of layers in the die 54 will vary for different applications.

Circuit layer 44 includes signal pads 30a, 30b, 30c arranged in a die bonding pad interconnect array 30 for interconnect signals thereon. Interconnect signals on signal pads 30a, 30b, 30c are routed to other circuits and to die bonding pads 70a, 70b, 70c on the package using vias 36a, 36b, 36c and 37a, 37b, 37c and redistribution metal in layers 36b and 36d. The circuit layer 44 is interfaced with the redistribution pads in the die substrate via a bond 32 between each circuit pad 30a, 30b, 30c and respective substrate pads 42a, 42b, 42c.

Die 54 includes input/output (I/O) pads 70a, 70b, 70c arranged in a die bonding pad interconnect array 70 for interconnect signals thereon. Package 55 comprises package bonding pads 62a, 62b, 62c positioned to match the locations of the die bonding pads 70a, 70b, 70c on the package. Die 54 is interfaced with substrate 64 via a bond 72 between each die pad 70a, 70b, 70c to each respective package pad 62a, 62b, 62c.

Substrate 64 is implemented using the innermost circuit layer 66c allocated to ground ($V_{SS}$) and the outermost circuit layers 66a and 66e allocated to interconnection pads and positive voltage ($V_{DD}$). The second and fourth circuit layers 66b and 66d are allocated to signal redistribution, and as such, variable depth vias 76a, 76b, 76c are utilized to route signals between the interconnection pads 62a, 62b, 62c in layer 66a and signal traces in circuit layers 66b, 66d. Variable depth vias 87a, 87b, 87c route signals between the conductive traces in circuit layer 66b, 66d to bonding pads 86a, 86b, 86c in conductive layer 66e.

Bonding pads 86a, 86b, 86c of the integrated circuit package 55 are bonded to bonding pads 90a, 90b, 90c in circuit layer 60a of circuit board 50 by conductive bonds 88. Each bonding pad 90a, 90b, 90c is electrically connected to a respective conductive trace (not shown) in the circuit layer 60a. The trace typically connects to a via 94a, 94b, 94c which serves to ultimately connect the bonding pad to power, ground, or further redistribution metal in one of the conductive layers 60a, 60b, 60c, 60d, 60e.

In summary, signals generated by output drivers in the circuit layer 44 of die 54 are electrically coupled to the transmission line 58 of the circuit board 50 through die vias, pads, and redistribution metal, die-to-package bonds, package vias, pads, and redistribution metal, package-to-circuit board bonds, and circuit board pads, vias, and redistribution metal. Each conductive component in a signal path connecting an output driver implemented in circuit layer 44 of die 54 and a transmission line (which may be variously defined, as hereinafter described) comprises the redistribution metal for a respective signal and contributes to the parasitics of the redistribution metal.

Turning now to the invention itself, the output driver of the invention leverages the otherwise undesirable parasitic capacitance of redistribution metal to control the slew rate of the output driver. The length and width of the redistribution metal, along with neighboring metal layers underneath are design parameters which can be used to minimize inductance and resistance while choosing redistribution metal with appropriate characteristic capacitance to essentially "dial up" the desired slew rate for the output driver.

As known in the art, the load capacitance and the impedance (parallel combination of output impedance $Z_D$ and transmission line characteristic impedance $Z_O$) add to the RC time constant of the signal, which affects how quickly the output signal transitions. As also known in the art, the voltage on a transmission line rises or falls in accordance with the equation: $V(t)=V_O*e^{-t/RC}$ where $V_O$ is the initial voltage, t is time and RC is the time constant of the RC circuit (i.e., the product of the impedance (or Thevenin equivalent resistance) and capacitance). In accordance with the invention, since the output impedance $Z_D$ of the driver circuit is known, the chip designer can choose a redistribution metal having a characteristic capacitance $C_O$ (typically determined by the length and width of the redistribution metal) corresponding to a resulting desired slew rate.

Figure 3:
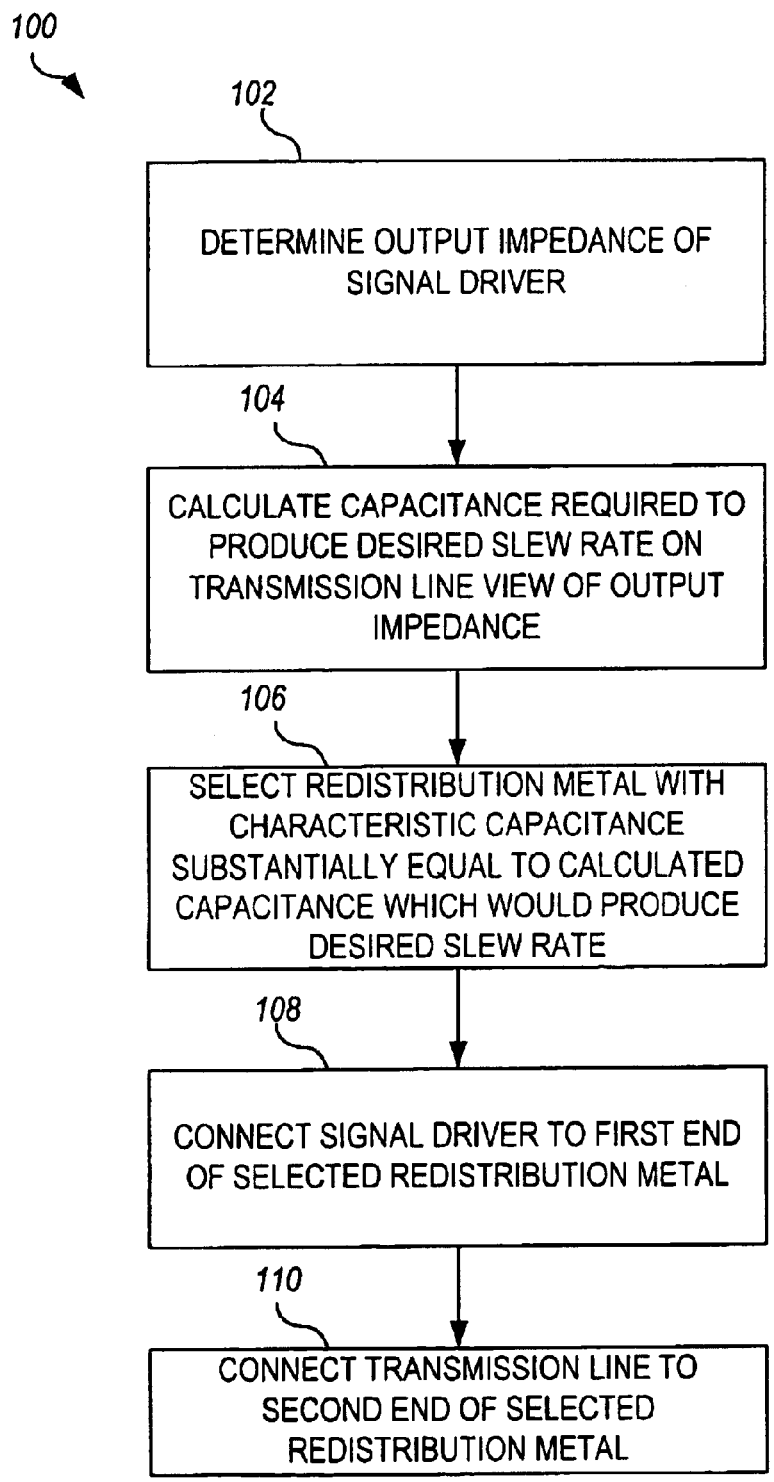
FIG. 3 is an operational flowchart of a method for controlling the slew rate of integrated circuit signals in accordance with the invention.

FIG. 3 depicts a method 100 for controlling the slew rate of integrated circuit signals in accordance with the invention. As illustrated, the designer determines (step 102) the output impedance $Z_D$ of the signal driver driving the signal of interest. The output impedance $Z_D$ is determined by the sizes of the transistors implementing the output driver cell.

The capacitance required to produce an RC time constant which will result in a desired slew rate on the transmission line is calculated (step 104), taking into account the output impedance $Z_D$ of the signal driver.

The designer then selects (step 106) a redistribution metal having a characteristic capacitance $C_{RM}$ which, given the known output impedance $Z_D$ of the signal driver, will produce a desired slew rate for the transitioning edges of the signal driven onto the transmission line.

The output of the signal driver is connected (step 108) to a first end of the selected redistribution metal. The transmission line is then connected (step 110) to a second end of the selected redistribution metal.

Figure 4A:
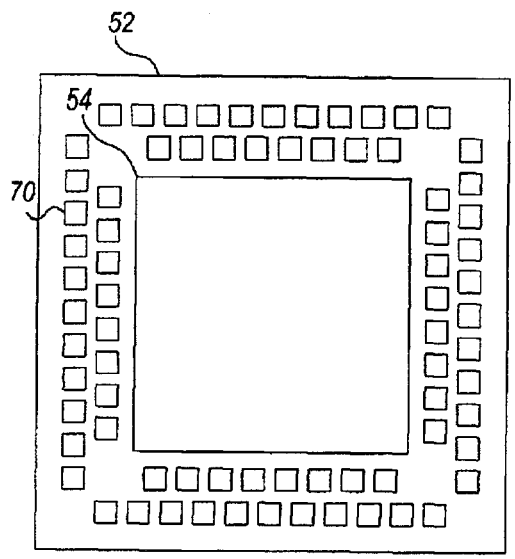
FIG. 4A is a plan view of an example of a die pad layout pattern for the die of FIGS. 2A–2C.

FIG. 4A is a plan view of an example of a die pad layout pattern for die 54 of integrated circuit 52 of FIGS. 2A–2C. In this example, the die pads 70 are laid out in a staggered pattern and are intended to be bonded to a ball grid array package (not shown) with solder bumps. Of course, many pad layout patterns, package types, and bonding techniques exist, and the principles of the invention extend easily to any of these layout patterns, package types, and bonding techniques.

Figure 4B:
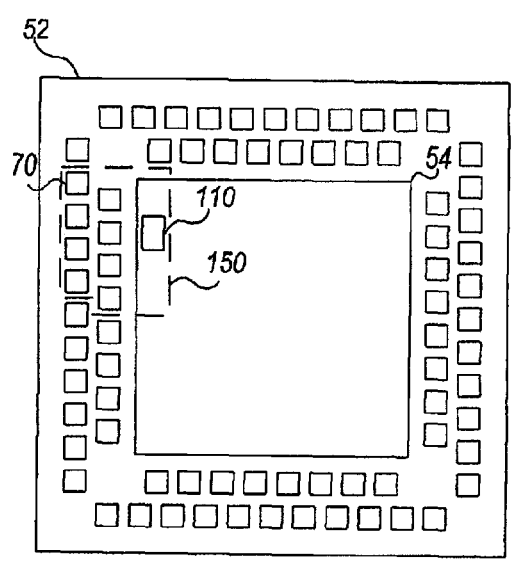
FIG. 4B is a plan view of the die of FIG. 4A illustrating an output pad block.

FIG. 4B is a plan view of the die pad layout pattern of FIG. 4A for integrated circuit 52 with an output pad block 110 indicated. In this embodiment, output pad block 110 includes a plurality of output driver cells 112 (see FIG. 4C) that are each to be connected to a different die pad 70 in the vicinity of area 150 via redistribution metal.

Figure 4C:
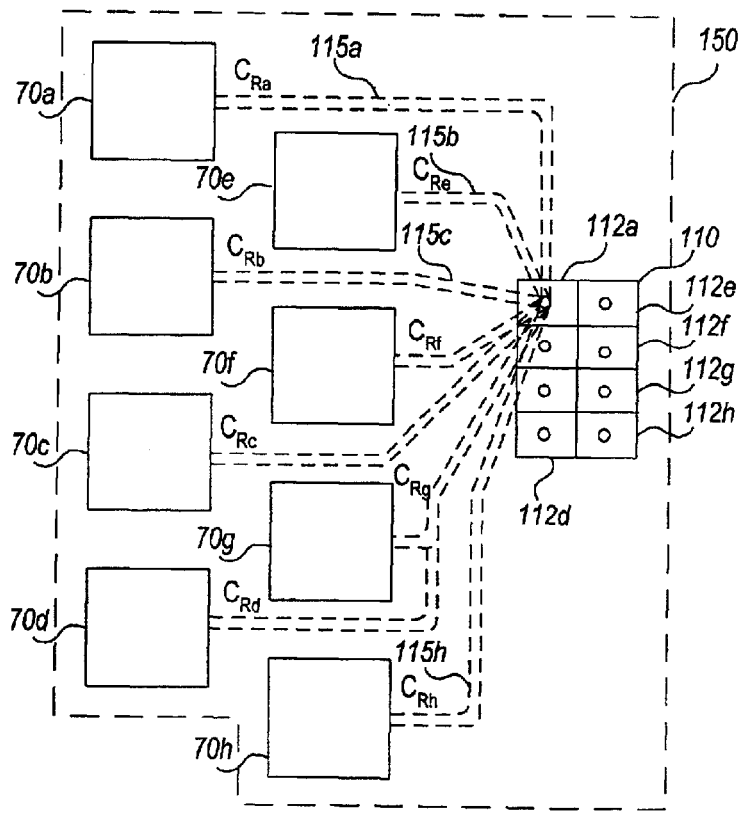
FIG. 4C is an exploded view of a portion of the die of FIG. 4B illustrating the mapping of a first output driver cell to a die pad.

FIG. 4C is an exploded view of area 150, illustrating how a given output driver cell 112a may be mapped for interconnection to a die pad 70. In this illustration, output driver cell 112a has the possibility of interconnection to any one of the die pads 70a–70h. During layout, the capacitance $C_{Ra}$, $C_{Rb}$, $C_{Rc}$, ..., $C_{Rh}$ of the redistribution metal 115a, 115b, 115c, ..., 115h required to connect the output driver cell 112a and each of die pads 70a–70h is estimated. Estimation techniques are discussed hereinafter.

Since the output impedance $Z_D$ of the output driver cell 112a is known from the design, the goal is to map the output driver cell 112a to one of the die pads 70a–70h whose proposed connective redistribution metal 115a–115h is characterized by a respective capacitance $C_{Ra}$–$C_{Rh}$ that will produce an RC time constant appropriate for generating a desired transmission line slew rate for the signal generated by the output driver cell 112a.

Figure 4E:
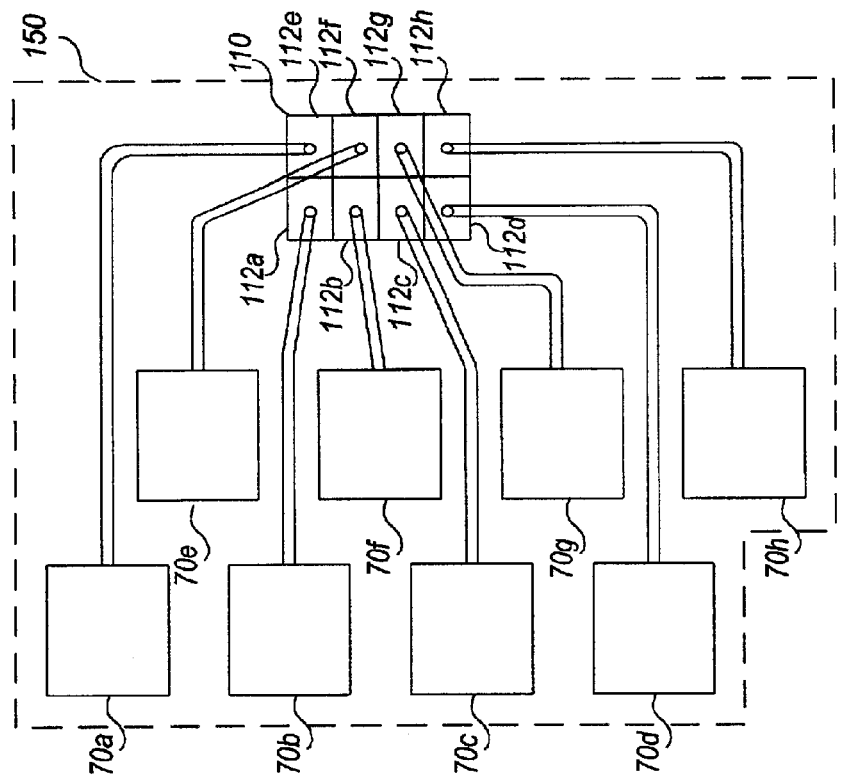
FIG. 4E is a completed output-driver-to-pad mapping for the output driver block of FIG. 4B.
Figure 4D:
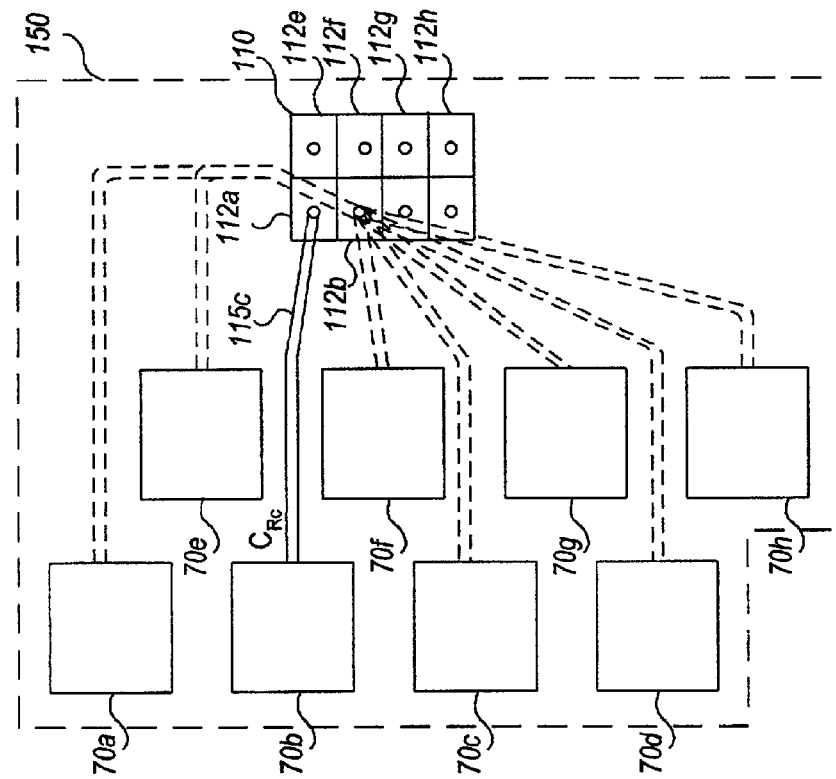
FIG. 4D is an exploded view of the portion of the die of FIG. 4B illustrating the mapping of a second output driver cell to a die pad.

FIG. 4D shows that, in the present example, die pad 70b is assigned to output driver cell 112a since the character capacitance $C_{Rc}$ of the redistribution metal 115c provides the desired redistribution metal RC time constant.

FIG. 4D also illustrates the mapping possibilities for output driver cell 112b given the mapping assignment of output driver cell 112a. In this illustration, output driver cell 112b has the possibility of interconnection to any one of the die pads 70a, or 70c–70h. During layout, the characteristic capacitance of the redistribution metal required to connect the output driver cell 112b to each of die pads 70a and 70c–70h is estimated. The output driver cell 112 is mapped to one of the die pads 70a, 70c–70h whose connective redistribution metal is characterized by a capacitance $C_R$ that will produce a desired RC time constant appropriate for generating the desired transmission line slew rate given the known output impedance $Z_D$ of the output driver cell 112b.

FIG. 4E illustrates that, based on the capacitance estimates for the redistribution metal connections, output driver cell 112b is assigned to die pad 70f.

The capacitance estimation and mapping process is repeated for each remaining output driver cells 112c–112h. FIG. 4E is a completed output-driver-to-pad mapping for output driver block 110, which shows that output driver cell 112c has been mapped to pad 70c, output driver cell 112d has been mapped to pad 70d, output driver cell 112e has been mapped to pad 70a, output driver cell 112f has been mapped to pad 70e, output driver cell 112g has been mapped to pad 70g, and output driver cell 112h has been mapped to pad 70h.

Figure 5A:
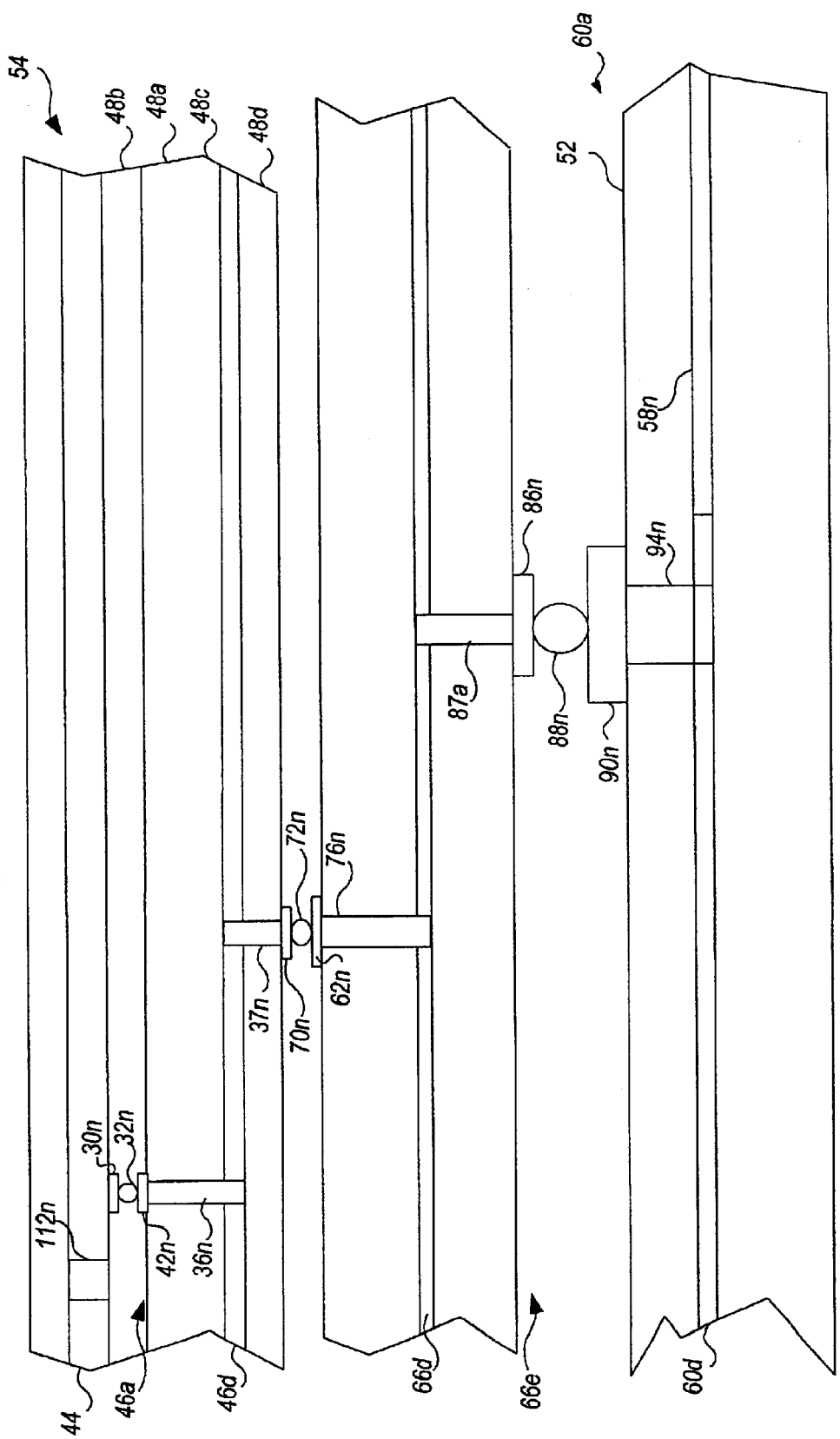
FIG. 5A is a side cross-sectional view of an integrated circuit device illustrating an example output driver-to-transmission line interconnect path.
Figure 5B:
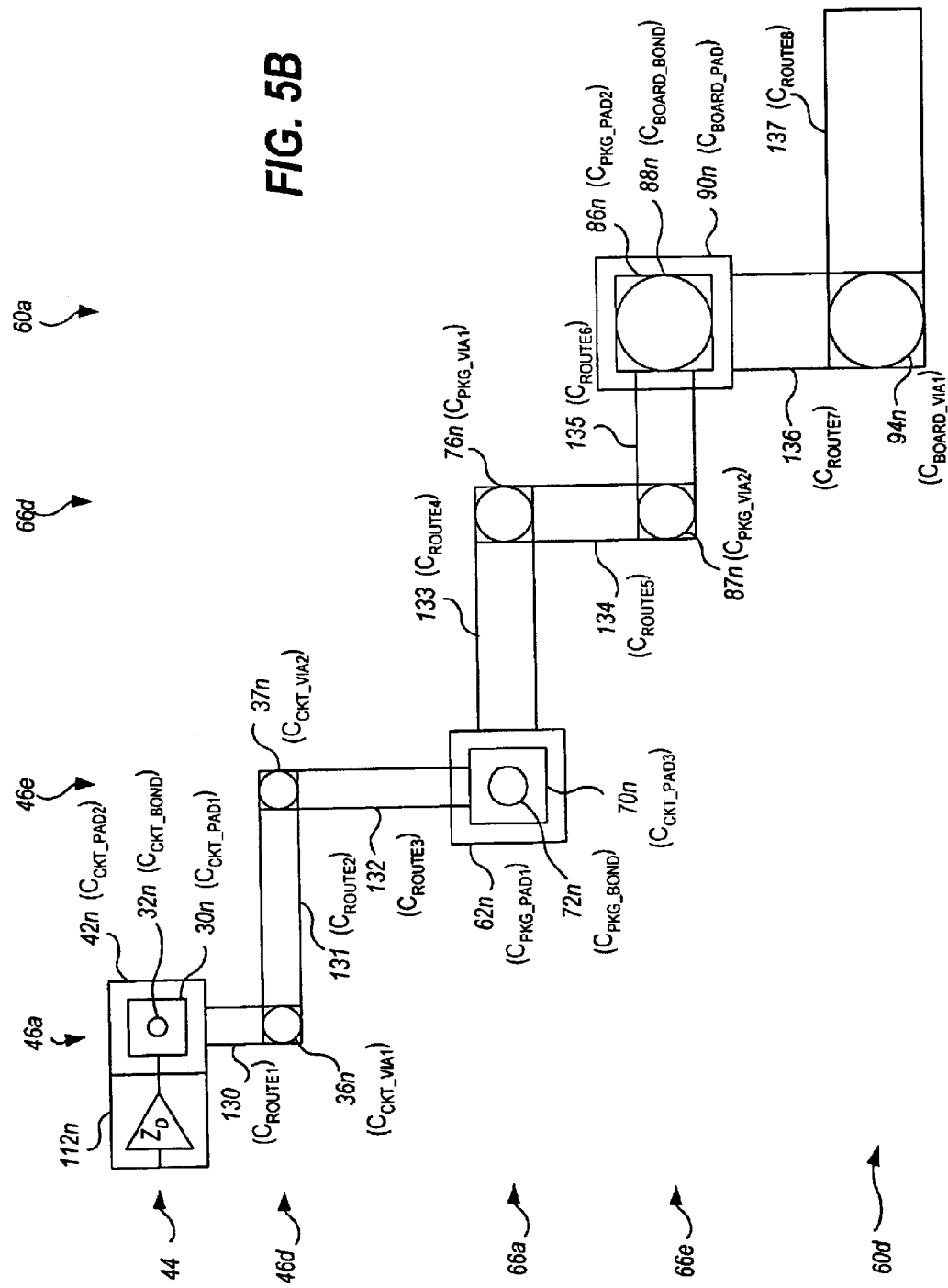
FIG. 5B is a top plan view of the integrated circuit device illustrating the example output driver-to-transmission line interconnect path of FIG. 5B.

FIG. 5A is a side cross-sectional view and FIG. 5B is a top plan view of an integrated circuit device illustrating an example output driver-to-transmission line interconnect path. As illustrated, the output driver 112n implemented in circuit layer 44 of die 54 is electrically connected to the transmission line 58n through (in order) circuit pad 30n, bond 32n, pad 42n, route 130 (in substrate layer 46a), via 36n, route 131 (in substrate layer 46d), via 37n, route 132 (in substrate layer 46e), die pad 70n, bond 72n, package pad 62n, route 133 (in package layer 6a), via 76n, route 134 in package layer 66d, via 87n, route 135 (in package layer 66e), pad 86n, bond 88n, circuit board pad 90n, route 136 (in circuit board layer 60a), via 94n, and route 137 (in circuit board layer 60d). As known, each interconnect component contributes to the parasitics of the redistribution metal for the output driver-to-transmission line interconnection. Accordingly, assuming that the total redistribution metal required for the output driver-to-transmission line interconnection includes all of the aforementioned components, the associated redistribution metal capacitance is given by:

$$C_{RM} = C_{CKT\_PAD1} + C_{CKT\_BOND} + C_{CKT\_PAD2} + C_{ROUTE1} +$$
$$C_{CKT\_VIA1} + C_{ROUTE2} + C_{CKT\_VIA2} + C_{ROUTE3} +$$
$$C_{CKT\_PAD3} + C_{PKG\_BOND} + C_{PKG\_PAD1} + C_{ROUTE4} +$$
$$C_{PKG\_VIA1} + C_{ROUTE5} + C_{PKG\_VIA2} + C_{ROUTE6} +$$
$$C_{PKG\_PAD2} + C_{BD\_BOND} + C_{BD\_PAD} + C_{ROUTE6} +$$
$$C_{ROUTE7} + C_{BD\_VIA} + C_{ROUTE8}$$

In practice, in determining which components are necessary to include in the impedance compensation modeling, (for example, does the transmission line begin in the die itself, at the package connection, or at the circuit board connection), the switching speed of the signals determine the treatment of the redistribution components as transmission lines. Typically, for signals less than 500 MHz, the package can be treated as a lumped RLC model such that the package redistribution is factored in when calculating the wire load capacitance. If the signal is faster (e.g., a signal with a slew rate of 50 picoseconds or faster in a 10 mm ceramic package), the package redistribution metal is treated like a transmission line, and accordingly, the package components (pads, vias, and routing) need not be modeled in the capacitance calculations. In most applications, the circuit board components are treated as a transmission line, so the capacitance of the circuit board components need not be included in the redistribution metal capacitance calculations.

It has been determined that if a time $t=3RC_{RM}$ generally results in approximately 95% rise or fall time. Accordingly, choosing a redistribution metal with a higher characteristic capacitance $C_{RM}$ will result in a slower slew rate.

The parasitics of each interconnect component to be modeled (e.g., pads, vias, routing metal, bonds) can be predicted during the floorplanning stage. At the floorplanning stage, although the impedance of the various components of the interconnect path cannot be predicted since the shape of the interconnect is not known until the routing stage, the total length of the interconnect can be estimated and thus the total capacitance estimated. Techniques exist for estimating capacitance as a function of net fanout and block size. A floorplanning tool can then use these predicted-capacitance tables (also known as interconnect-load tables or wire-load tables) to estimate the capacitance of net connections.

Typically, the locations of the die interconnect pads will be dictated by the package type. During the floorplanning stage, the locations of the chip pads are set using pad seeds input to the floorplanning tool. Pad seeds instruct the floorplanning tool to fix the position of the associated chip pad. Seeding may also be used to fix the positions of the output drivers in the chip. Accordingly, the designer can adjust the estimated length (and therefore characteristic capacitance) of the redistribution metal between the output driver cell and chip pad by hard seeding output driver cell to a certain position.

Existing floorplanning and routing techniques beyond the scope of the invention allow fixed placement of, and interconnection between, logic cells (for example, an output driver cell) and pad cells of the chip.

Calculations using TSMC.13 process design rules show that the inductance and resistance can be kept minimal while the capacitance can easily be made large enough to impact the signal slew rates as much as desired assuming communication rates are faster than 1 MHz. SPICE simulations have shown that added capacitance on the output driver slows down the slew rates linearly (and desirably), and does not negatively impact the simultaneously switching output (SSO) noise, a key design parameter related to high speed input/output devices.

It will be appreciated that the invention provides several advantages over the prior art. As indicated above, redistribution metal is metal on any given conductive layer generally used for routing output and input signals on the integrated circuit to more desirable locations for solder bumping or wirebond packaging applications. An undesirable byproduct of using redistribution metal is it adds parasitic resistance, inductance, and capacitance. These parasitics are normally undesirable and require additional compensation circuitry in the driver/receivers of integrated circuits.

However, the invention takes advantage of the parasitic capacitance C of the redistribution metal to control the signal slew rate. By calculating the amount of capacitance needed to achieve an RC time constant corresponding to a desired slew rate using the known driver output impedance $Z_D$, the length of the redistribution metal is chosen to leverage the parasitic capacitance C of the chosen redistribution metal to essentially "program" the slew rate of the signal on the transmission line. The added advantage of the inventive technique for controlling the slew rate of signals is that it requires no slew rate control circuitry which would otherwise add complexity and cost to the chip.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for controlling the slew rate of a signal driven by a signal driver characterized by an output impedance onto a transmission line of an integrated circuit device, comprising:

determining a desired slew rate for said signal;

calculating characteristic capacitance which together with said signal driver output impedance will produce a resulting time constant on said transmission line to achieve said desired slew rate;

calculating an interconnection path characterized by a redistribution metal characteristic capacitance substantially equal to said calculated characteristic capacitance.

2. A method in accordance with claim 1, wherein:

said calculated characteristic capacitance is selected such that for a desired 95% full signal transition time t, t is approximately equal to $3*Z_D*C_{RM}$, where $Z_D$ comprises said signal driver output impedance and $C_{RM}$ comprises said redistribution metal characteristic capacitance.

3. A method in accordance with claim 2, comprising:

connecting said signal driver to a first end of said interconnection path; and connecting said transmission line to a second end of said interconnection path.

4. A method in accordance with claim 1, comprising:

connecting said signal driver to a first end of said interconnection path; and connecting said transmission line to a second end of said interconnection path.

5. An integrated circuit, said integrated circuit comprising:

a transmission line;

a signal driver characterized by an output impedance which drives a signal onto a transmission line; and redistribution metal connecting said signal driver to said transmission line, said redistribution metal selected to be characterized by a redistribution metal characteristic capacitance that is determined by calculating said redistribution metal characteristic capacitance which together with said signal driver output impedance will produce a resulting time constant on said transmission line to achieve a desired slew rate on said transmission fine when said signal transitions from a first state to a second state.

6. An integrated circuit device in accordance with claim 5, wherein:

said redistribution metal characteristic capacitance comprises a value $C_{RM}$ such that for a desired 95% full signal transition time t, t is approximately equal to $3*Z_D*C_{RM}$, where $Z_D$ comprises said signal driver output impedance.

* * * * *